(12) United States Patent
Murakami et al.

(10) Patent No.: US 10,297,295 B2
(45) Date of Patent: May 21, 2019

(54) SEMICONDUCTOR MEMORY DEVICE

(71) Applicant: Winbond Electronics Corp., Taichung (TW)

(72) Inventors: Hiroki Murakami, Taichung (TW); Makoto Senoo, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 15/692,381

(22) Filed: Aug. 31, 2017

(65) Prior Publication Data
US 2018/0061462 A1 Mar. 1, 2018

(30) Foreign Application Priority Data

Sep. 1, 2016 (JP) .................................. 2016-170625

(51) Int. Cl.
G11C 7/10 (2006.01)
G11C 7/22 (2006.01)
G11C 8/18 (2006.01)
G11C 11/4093 (2006.01)
G11C 16/04 (2006.01)
G11C 16/08 (2006.01)
(Continued)

(52) U.S. Cl.
CPC ............ *G11C 7/109* (2013.01); *G11C 7/1006* (2013.01); *G11C 7/1063* (2013.01); *G11C 7/1066* (2013.01); *G11C 7/1093* (2013.01); *G11C 7/222* (2013.01); *G11C 8/18* (2013.01); *G11C 11/4093* (2013.01); *G11C 16/0483* (2013.01); *G11C 16/08* (2013.01); *G11C 16/10* (2013.01); *G11C 16/26* (2013.01); *G11C 16/32* (2013.01)

(58) Field of Classification Search
None
See application file for complete search history.

(56) References Cited

U.S. PATENT DOCUMENTS 6,172,935 B1 * 1/2001 Wright ................. G11C 7/1072
365/194
9,304,579 B2 4/2016 Ware et al.
(Continued)

FOREIGN PATENT DOCUMENTS

JP 2004219097 A 8/2004
JP 2007128646 A 5/2007
TW 200636454 A 10/2006

*Primary Examiner* — Douglas King
(74) *Attorney, Agent, or Firm* — Muncy, Geissler, Olds & Lowe, P.C.

(57) ABSTRACT

A semiconductor memory device which is capable of high-speed operation in synchronization with external control signals is provided. The semiconductor memory device has a data input portion, a memory array, a data output portion, and a control portion. The data input portion receives command and address input data in response to the external control signals. The memory array has a plurality of memory elements. The data output portion outputs data read from the memory array in response to the external control signals. The control portion has the function of delay-compensation. During the time interval for receiving the input data, the function of delay-compensation estimates the delay time of the internal circuits, stores the estimated delay-time in a memory unit, and adjusts the output timing of the data output portion.

12 Claims, 10 Drawing Sheets

(51) Int. Cl.
*G11C 16/10* (2006.01)
*G11C 16/26* (2006.01)
*G11C 16/32* (2006.01)

(56) References Cited

U.S. PATENT DOCUMENTS

| | | | |
|---|---|---|---|
| 2002/0123853 A1* | 9/2002 | Simon | G01R 31/3191 702/107 |
| 2005/0286320 A1* | 12/2005 | Iwasaki | G11C 7/1072 365/189.05 |
| 2011/0128060 A1 | 6/2011 | Ishino et al. | |
| 2011/0128794 A1* | 6/2011 | Yoon | G11C 7/1051 365/189.05 |
| 2013/0111112 A1* | 5/2013 | Jeong | G06F 13/1689 711/103 |
| 2014/0241082 A1* | 8/2014 | Tam | G11C 7/222 365/194 |
| 2015/0098275 A1 | 4/2015 | Kim et al. | |
| 2016/0364345 A1* | 12/2016 | Jeter | G06F 13/161 |

* cited by examiner

SEMICONDUCTOR MEMORY DEVICE

CROSS REFERENCE TO RELATED APPLICATIONS

The present application is based on, and claims priority from, Japan Applications Serial Number JP 2016-170625, filed Sep. 1, 2016, the disclosure of which is hereby incorporated by reference herein in their entirety.

BACKGROUND OF THE INVENTION

Field of the Invention

The disclosure relates to a semiconductor memory device, and in particular it relates to a semiconductor memory device performing data input/output in response to an external control signal.

Description of the Related Art

In recent years, NAND-type flash memory and NOR-type flash memory have required high-speed data transmission. Devices such as DRAM with burst read mode have internal latency, but it is difficult for flash memory to synchronize an internal data transmission with an external control signal because of there being no latency.

For example, the input/output interface of a NAND-type flash memory distinguishes commands and addresses using a plurality of external control signals. In a read operation, the read command from the I/O terminal is latched in the input/output buffer in response to the rising edge of the write enable signal when the command-latch enable signal of the external control signals is in an H state, and the address from the I/O terminal is latched in the input/output buffer in response to the rising edge of the write enable signal when the address-latch enable signal of the external control signals is in an H state. The flash memory outputs a busy signal when data are read from a memory cell array and switches from the busy signal to a ready signal when the preparation for outputting data is ready. When the read enable signal of the external control signals is applied, the data stored in the input/output buffer are serially output from the I/O terminal in response to the falling edge of, for example, the read enable signal.

Because of the internal delay which depends on the chip environment, such as variations in temperature and the supplied voltage, it is difficult to perform data input/output by synchronizing the data transmission in the chip with the signal (such as the write enable signal and read enable signal) applied from outside of the chip. In particular, if the clock frequency (or pulse frequency) of the external control signal is higher and the variation of the frequency is greater, it becomes more difficult to carry out delay compensation with the appropriate timing, possibly hindering the chip's operation at high speeds.

BRIEF SUMMARY OF THE INVENTION

The present disclosure provides a semiconductor memory device to overcome the conventional problems and to be in synchronization with the external control signals for high-speed operation.

A semiconductor memory device of the present disclosure comprises a data input device, a delay estimation device, a memory array, a data output device, and a timing adjustment device. The data input device receives input data in response to an external control signal. The delay estimation device estimates the delay time of an internal circuit which is operable in response to the external control signal during the time interval of receiving the input data and stores to a memory unit the delay information obtained from the estimate. The memory array has a plurality of memory elements. The data output device outputs data read from the memory array in response to the external control signal. The timing adjustment device adjusts the output timing of the data output device based on the delay information stored in the memory unit.

It is preferred that the delay estimation device further estimates the delay time of the internal circuit during the time period when the data output device outputs data, and further updates the delay information stored in the memory unit according to the delay information obtained from the estimate. It is preferred that the semiconductor memory device further comprises a detection device detecting temperature information related to operation temperature; wherein the delay estimation device comprises a calibration device calibrating the delay information based on the temperature information. It is preferred that the internal circuit comprises an RC delay device for generating a pulse signal indicating delay time. It is preferred that the delay estimation device comprises a delay code generation device generating a delay code based on the pulse signal output from the internal circuit, and that the generated delay code serves as the delay information and is stored in the memory unit. It is preferred that the timing adjustment device adjusts the RC delay of the data output device based on the delay information. It is preferred that the timing adjustment device adjusts the gate delay of the data output device based on the delay information. It is preferred that the external control signal is a write enable signal for reading the data into the data input device. It is preferred that the external control signal is a read enable signal for outputting the data from the data output device. It is preferred that the input data is a command. It is preferred that the input data is a command related to a read operation and that the timing adjustment device adjusts the timing of the data output device when outputting read data. It is preferred that the semiconductor memory device is a NAND-type flash memory.

According to the present disclosure, by estimating the delay of the internal circuit during the time period when the input data are received, storing the delay information obtained from the estimation in the memory unit and adjusting the output timing of the data output device based on the delay information, the semiconductor memory device can output data by appropriate timing in response to the external control signal without influence of the operation environment.

BRIEF DESCRIPTION OF THE DRAWINGS

The disclosure can be more fully understood by reading the subsequent detailed description and examples with references made to the accompanying drawings, wherein.

DETAILED DESCRIPTION OF THE INVENTION

Hereinafter, the exemplary embodiments of the present disclosure will be described in detail in reference to the accompanying drawings. The semiconductor memory device of the present disclosure is not particularly limited and the semiconductor memory device which can input and output data in synchronization with external control signals, such as NOR-type flash memory and NAND-type flash memory, is preferred.

Figure 1:
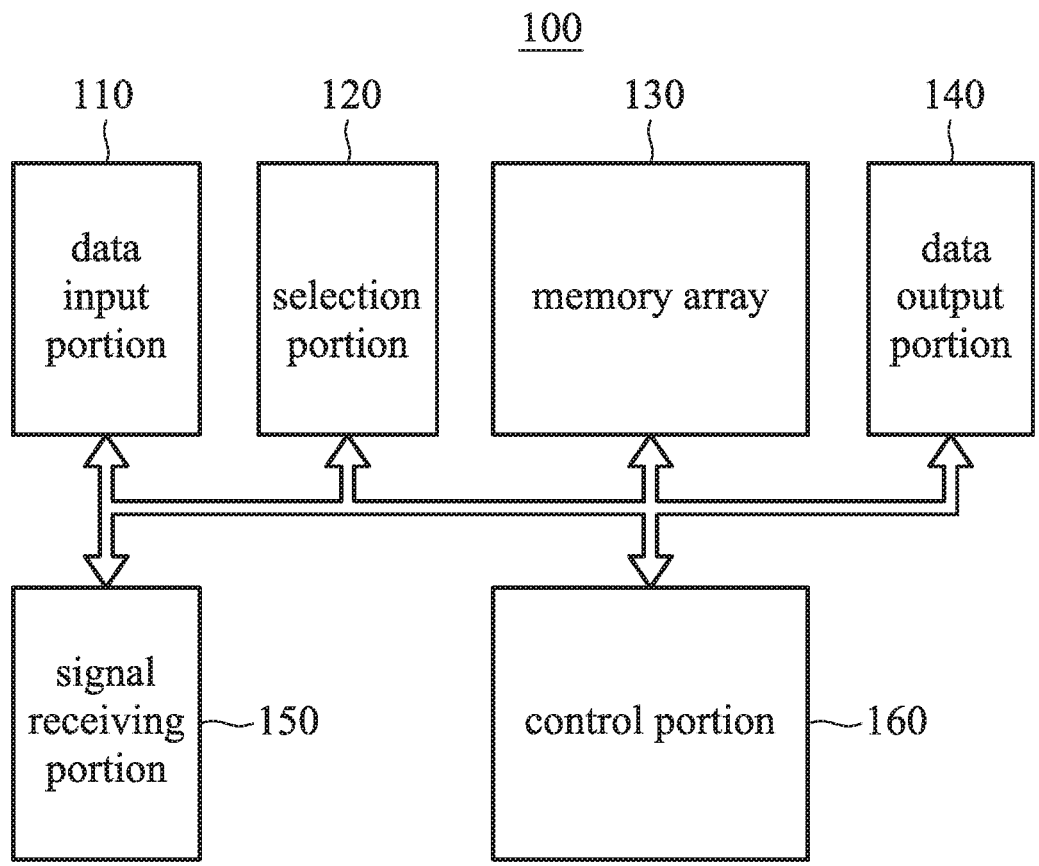
FIG. 1 schematically shows block diagrams of a semiconductor memory device according to some exemplary embodiment of the present disclosure.

FIG. 1 schematically shows a structure of a semiconductor memory device according to some exemplary embodiments of the present disclosure. The semiconductor memory device 100 of this exemplary embodiment comprises a data input portion 110, a selection portion 120, a memory array 130, a data output portion 140, a signal receiving portion 150, and a control portion 160. The data input portion 110 receives commands, addresses, write data, etc. from the outside. The selection portion 120 selects memory elements of the memory array 130 based on the address received by the data input portion 110. The memory array 130 has a plurality of memory elements. The data output portion 140 outputs data read from the selected memory elements of the memory array 130. The signal receiving portion 150 receives external control signals. The control portion 160 controls the operations of the semiconductor memory device based on the external control signals received by the signal receiving portion 150 and the commands received by the data input portion 110.

The semiconductor memory device 100 can input and output data in synchronization with the external signals. The external control signals comprise signals for identifying input commands and addresses and signals for identifying read and write operations. The external control signals are applied from outside by a host device. The control portion 160 decodes the input commands in response to the external control signal and controls read and write operations.

Figure 2:
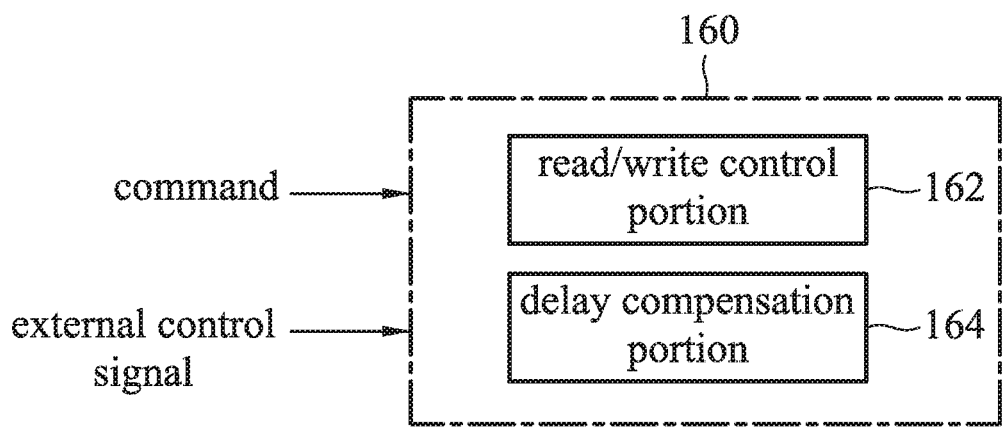
FIG. 2 schematically shows a block diagram of a control portion depicted in FIG. 1.

FIG. 2 shows the functional structure of the control portion 160. The control portion 160 comprises a read/write control portion 162 which controls read, write and erase (if the semiconductor memory device also performs erase operations) of the semiconductor memory device 100; and a delay-compensation portion 164 compensating for the delay of the internal circuit of the semiconductor memory device 100.

Figure 3:
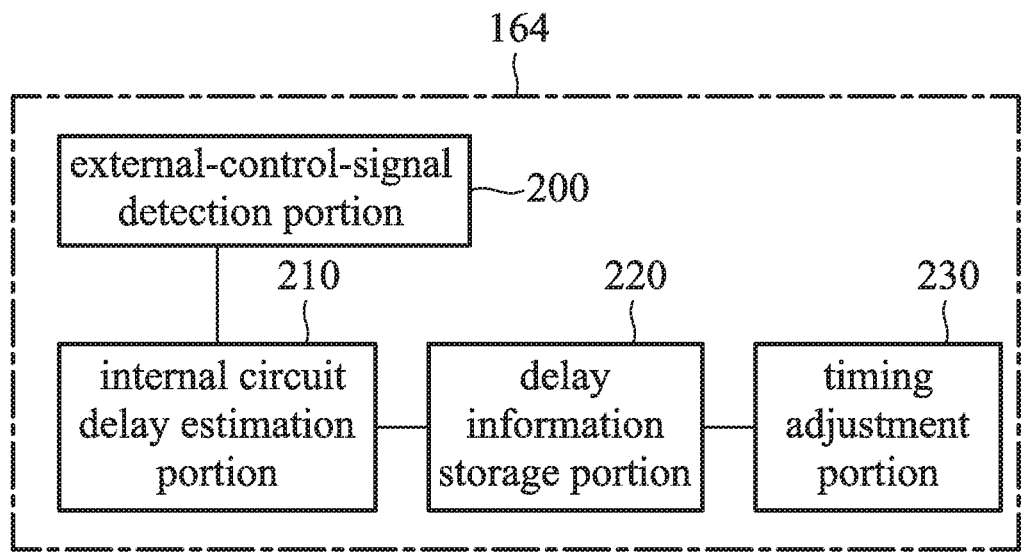
FIG. 3 schematically shows a delay-compensation portion according to some exemplary embodiment of the present disclosure.

FIG. 3 shows the internal structure of the delay-compensation portion 164. The delay-compensation portion 164 comprises an external-control-signal detection portion 200, an internal-circuit delay estimation portion 210, a delay information storage portion 220, and a timing adjustment portion 230. The external-control-signal detection portion 200 detects the external control signals. The internal-circuit delay estimation portion 210 estimates (evaluates) the delay of the internal circuits of the semiconductor memory device 100. The delay information storage portion 220 stores internal circuit delay information estimated by the internal-circuit delay estimation portion 210. The timing adjustment portion 230 controls the timing of the data output portion 140 based on the internal circuit delay information stored by the delay information storage portion 220.

The external control signal detection portion 200 detects whether the external control signal has been received, through the signal receiving portion 150. In a preferred embodiment, the external control signal detection portion 200 detects a required external signal at the time to take commands or addresses from I/O terminals into the data input portion 110. For example, when command and address data are taken in response to the rising edge or falling edge of the clock (or pulse) of the write enable signal, the external control signal detection portion 200 detects whether the write enable signal has been activated or enabled. In a preferred embodiment, the external control signal is not continuously input to the semiconductor memory device 100, and is merely a clocked signal (or a pulsed signal) during the period when the command and address data are taken into the data input portion 110.

The internal circuit delay estimation portion 210 estimates (evaluates) the internal circuit delay time of the semiconductor memory device 100 when the external control signal detection portion 200 detects the activation of the external control signal and during the period when the data are taken into the data input portion 110 in response to the external control signal. The internal circuit operates in response to the external control signal and may be capable of detecting the delay time thereof. The semiconductor circuit has different delay time which depends on the chip operation environment such as variations of the power supply voltage and temperature. If the delay time is not compensated for, the data output portion 140 fails to output correct data. The internal circuit delay estimation portion 210 detects the internal circuit delay time and provides the delay information storage portion 220 with the internal circuit delay information of the detected delay time. The delay information storage portion 220 stores the internal circuit delay information. The delay information storage portion 220 is not particularly limited and it is preferred to be registers or SRAM capable of performing read/write operations at high speed.

The timing adjustment portion 230 in advance adjusts the timing of the data output from the data output portion 140 based on the delay information stored by the delay information storage portion 220. It is preferred that the timing adjustment portion 230 adjusts the output timing of the data output portion 140 based on the delay information so as to suppress the delay of the data which are output by the initial clock signal of the external control signal.

Figure 4:
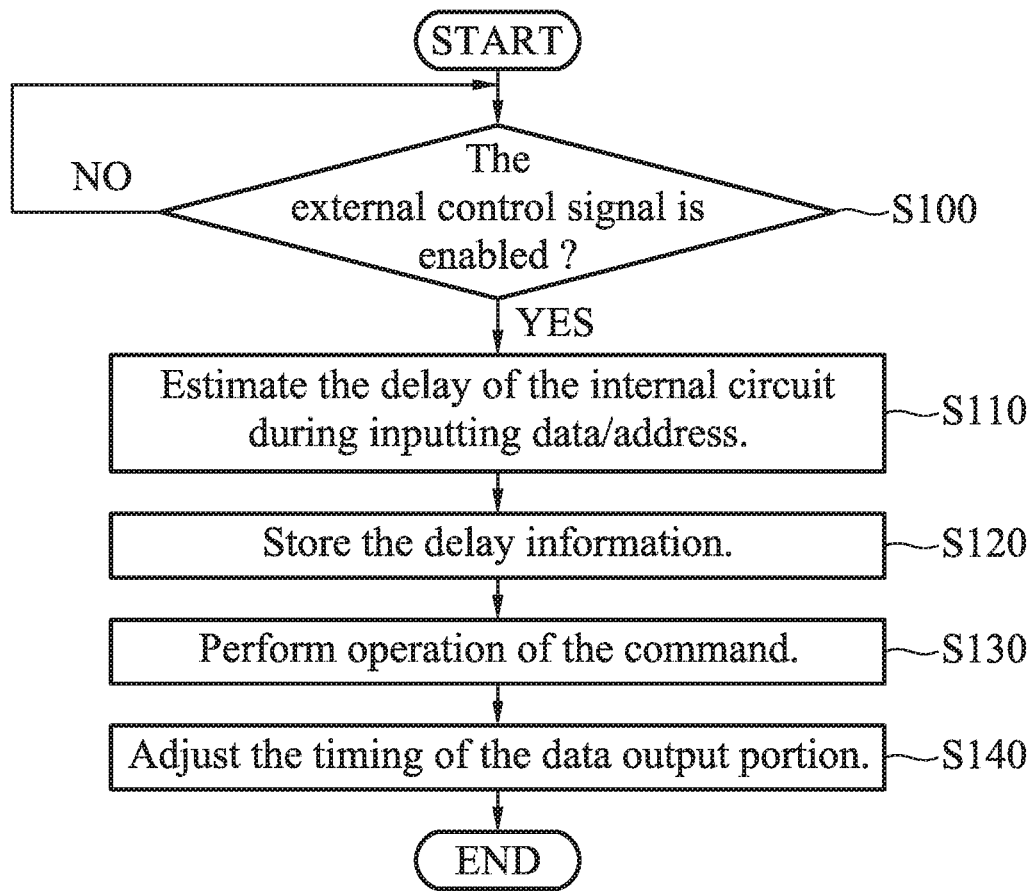
FIG. 4 is a flow chart for describing the operation of the delay-compensation portion according to some exemplary embodiment of the present disclosure.

FIG. 4 is a flow chart for describing the operation of the delay-compensation portion 164 according to some exemplary embodiments of the present disclosure. The external control signal detection portion 200 monitors the external control signal input to the signal receiving portion 150 and detects whether the external control signal for data input is activated (S100). When the external control signal is activated, the delay compensation portion 164 estimates the delay of the internal circuit which operates in response to the external control signal during the time interval of inputting data in response to the external control signal (S110). The delay information of the internal circuit delay estimated by this way is stored in the delay information storage portion 220 (S120).

After that, the semiconductor memory device 100 operates based on the input commands (S130). For example, when the read command is input, the selection portion 120 reads and transmits data from the memory array 130 to the data output portion 140.

Before the preparation for data output is ready, the timing adjustment portion 230 adjusts the timing of the data output portion 140 in advance (S140), by the delay information stored in the delay information storage portion 220. The timing adjustment portion 230 has obtained a delay time Td according to the delay information and therefore can perform delay compensation to the output timing of the data output portion 140 by the delay time Td. This is why the data output portion 140 can output data through appropriate timing without influences of the chip operation environment (such as variations of supply voltage and temperature).

Figure 5A:
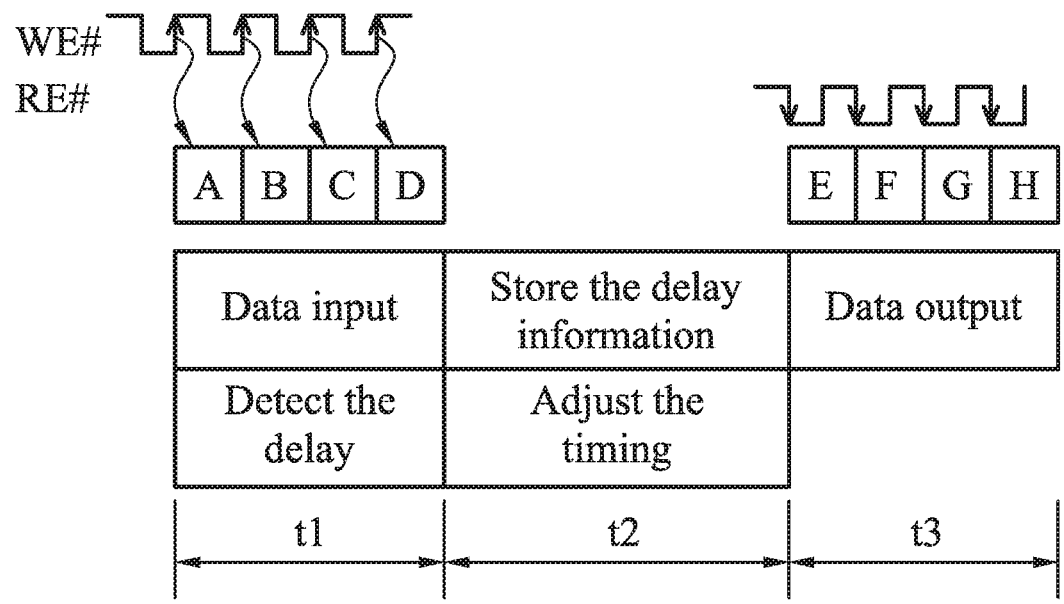
FIGS. 5A and 5B show an example for compensating delay of a data output portion by the delay-compensation portion according to some exemplary embodiment of the present disclosure.

FIG. 5A shows a preferred exemplary operation of the delay-compensation portion. For example, the write enable signal WE# ("#" indicates the signal is activated in low state) is applied as the external control signal, and data of command and address are taken into the data input portion 110 in response to the write enable signal WE#. Referring to FIG. 5A, data A, B, C and D are latched in the data input portion 110 in response to the rising edge of the write enable signal WE# and the delay time of the internal circuit which operates in response to the write enable signal WE# is detected, during the time interval t1. Next, during the time interval t2, the delay information of the detected delay time is stored in the delay information storage portion 220 and the timing of the data output portion 140 is adjusted based on the stored delay information. Also, during the time interval t2, for example the read operation is performed based on the input command. During the later time interval t3, data are output from the data output portion 140 whose timing has been adjusted. Referring to FIG. 5A, the read enable signal RE# is applied as the external control signal and data E, F, G and H are output from the data output portion 140 in response to the falling edge of the read enable signal RE#.

Figure 5B:
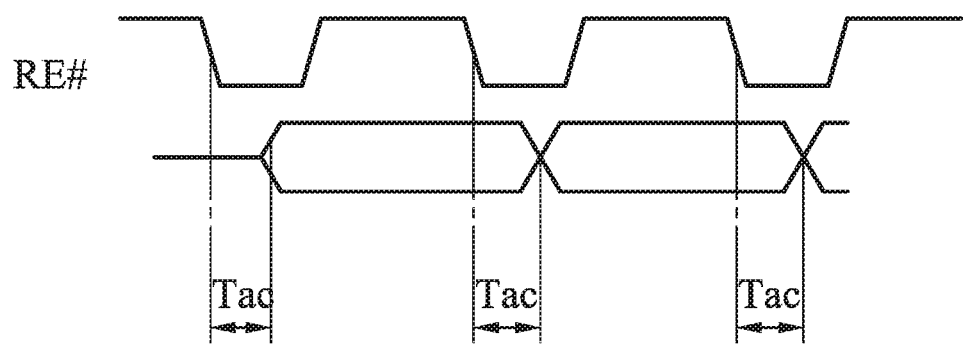

FIG. 5B shows timing waveforms when the data output portion 140 outputs the data. If the delay time of the internal circuit is Tac, the data output from the data output portion 140 are compensated for by the delay time Tac. That is, the correctness of the output data are not guaranteed if they are not output after the delay time Tac has passed from the falling edge of the clock or pulse of the read enable signal RE#. In this embodiment, the delay time Tac is known before outputting data and therefore adjusting the timing of the data output portion 140 before outputting data can perform delay compensation to the initial data which are output in response to the initial clock or pulse.

Figure 6A:
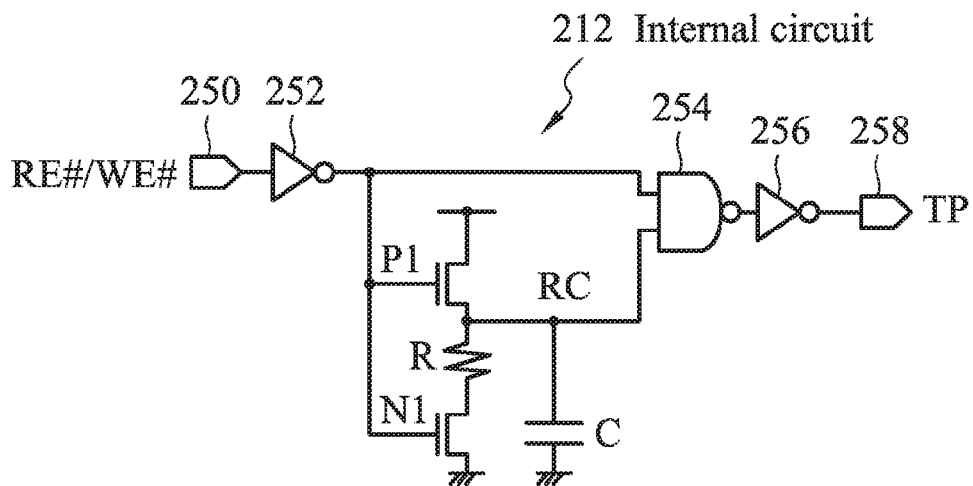
FIG. 6A shows an internal-circuit delay-estimation portion according to some exemplary embodiments of the present disclosure.
Figure 6B:
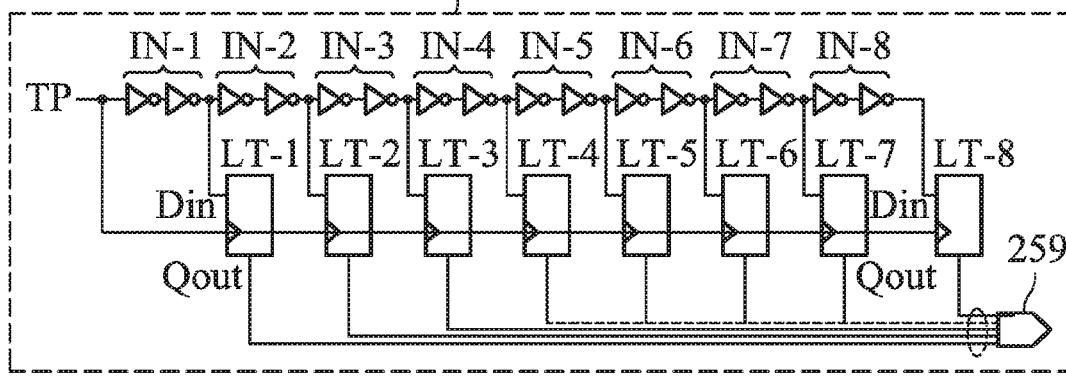
FIG. 6B shows an example of generating a delay code.

Next, the embodied structure of the internal circuit delay estimation portion 210 is shown in FIGS. 6A and 6B. The internal circuit delay estimation portion 210 estimates the internal circuit 212 which as depicted in FIG. 6A comprises inverters 252, 256, a PMOS transistor P1, a NMOS transistor N1, a resistor R1, a capacitor C and a NAND gate 254. However, the structure of the internal circuit 212 is an example, and it also can be other structures beside this example.

The read enable signal RE# and the write enable signal WE# are applied to the input node 250 and through the inverter 252 the signal RE# or WE# is commonly applied to the gates of the transistors P1 and N1. The source of the transistor P1 is connected to a supply voltage, the source of the transistor N1 is connected to a ground (GND), the resistor R is connected between the transistors P1 and N1 and the resistor R and the capacitor C are connected in parallel. The resistor R and the capacitor C connected to the node RC determine the time constant of the internal circuit. The external control signal (RE#/WE#) is applied to one input of the NAND gate 254 and the voltage at the node RC is applied to the other input of the NAND gate 254. The output of the NAND gate 254 is connected to the inverter 256 and the estimation signal for estimating the delay of the internal circuit 212 is output from the output node 258.

When the write enable signal WE# is at the H level, the transistor P1 turns on, the transistor N1 turns off and the node RC is charged to the H level. The output of the NAND gate 254 becomes the H level and the estimation signal TP becomes L level.

When the write enable signal WE# is activated by the L level, the transistor P1 turns off, the transistor N1 turns on and the node RC is discharged through the transistor N1. The voltage level of the node RC is not changed to the L level immediately. That is, the voltage level of the node RC is maintained at the H level during a specific delay time interval after the write enable signal WE# has changed to the L level. Therefore, during the RC delay time interval, both inputs of the NAND gate 254 become the H level and the estimation signal TP becomes the pulse of H level. The RC time is a function of the operation environment (such as variations of the supply voltage and the temperature) of the internal circuit.

The internal circuit delay estimation portion 230 comprises a delay code generation portion 214, as depicted in FIG. 6B. The delay code generation portion 214 comprises a plurality of inverter stages IN-1, IN-2, . . . , IN-8 and a plurality of latch circuits LT-1, LT-2, . . . , LT-8 respectively latching the output of the inverter stages IN-1, IN-2, . . . , IN-8. Each of the inverter stages comprises a pair of inverters. The estimation signal TP is input to the inverter stage IN-1 and one inverter stage generates a unit delay time.

Each of the latch circuit comprises an enable input, a data input Din and a data output Qout. The data output Qout outputs Din when the enable input is at the H level, and the data output Qout keeps the previous output data when the enable input is at the L level. The enable inputs of the latch circuits LT-1~LT-8 are input by the estimation signal TP, the data inputs (Din) of the latch circuits LT-1~LT-8 are respectively connected to the corresponding inverter stages IN-1~IN-8. The data outputs (Qout) of the latch circuits LT-1~LT-8 are output to the node 259. In FIG. 6B, the latch circuit has 8 stages and outputs the delay code of 8-bit. However, the number of stages and the bit number of the delay code are arbitrary.

Figure 6C:
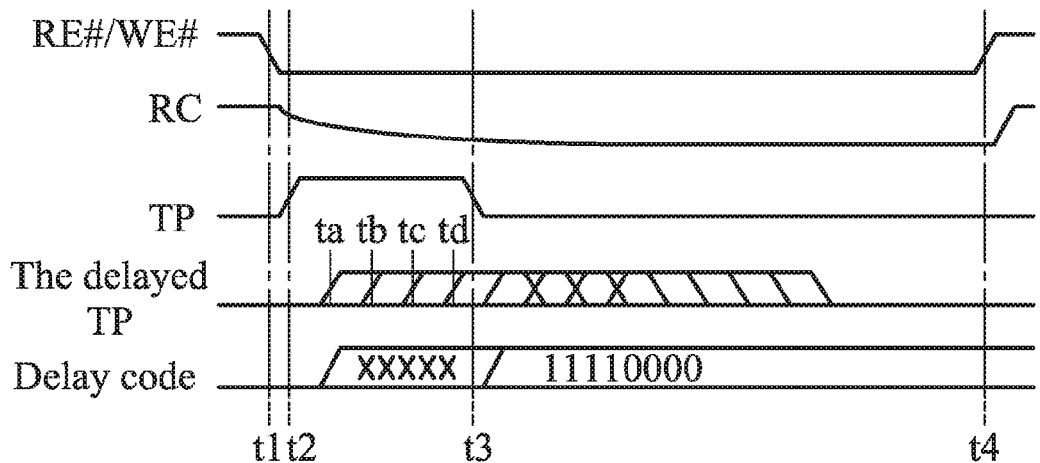
FIG. 6C shows the timing of the internal-circuit delay-estimation portion.

FIG. 6C is an example showing operation waveforms of the internal-circuit delay-estimation portion 230. Here, when the estimation signal TP is at the H level, the estimation signal TP of H level is transmitted to the data inputs (Din) of the 4 inverter stages IN-1~IN-4. After the write enable signal WE# for example, has changed to the L level at time t1, the estimation signal TP of H level is output from the output node 258 of the internal circuit 212 during the time interval from time t2 to t3. The estimation signal TP is input to the delay code generation portion 214.

The data input Din of the latch circuit LT-1 is input by the estimation signal TP-1 of H level, at time to which is later than time t2 by one unit of delay time. The data input Din of the latch circuit LT-2 is input by the estimation signal TP-2 of H level, at time tb which is later than time t2 by two units of delay time. The data input Din of the latch circuit LT-3 is input by the estimation signal TP-3 of H level, at time tc which is later than time t2 by three units of delay time. The data input Din of the latch circuit LT-4 is input by the estimation signal TP-4 of H level, at time td which is later than time t2 by four units of delay time. The time interval during which the estimation signal TP is at the H level is four units of delay time. When the data input Din of the latch circuit LT-5 is input by the estimation signal TP-5 at the time which is later than time t2 by five units of delay time, the estimation signal TP is at the L level. Since then, the latch circuit LT-6, LT-7, LT-8 of the latter stages are the same as the latch circuit LT-5.

When the estimation signal TP changes to the L level at time t3, data at the data input Din are kept, data outputs Qout of the latch circuits LT-1~LT-4 are maintained at the H level and data outputs Qout of the latch circuits LT-5~LT-8 are maintained at the L level Therefore, the 8-bit delay code of "11110000" is generated at the output node 259. The generated delay code is stored in the delay information storage portion 220 as delay information. After that, when the write enable signal WE# changes to the H level at time t4, the transistor P1 of the internal circuit 212 turns on, the node RC is charged to the H level and thus the estimation signal TP changes to the L level.

Figure 7:
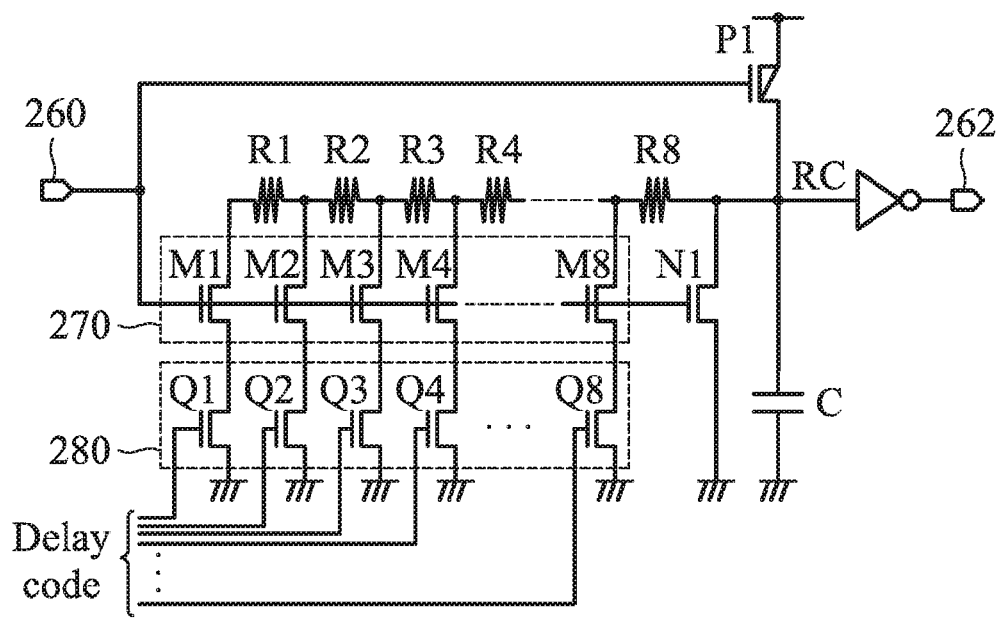
FIG. 7 shows a first example of a timing-adjustment portion according to some exemplary embodiments of the present disclosure.

Next, an embodied structure example of the timing adjustment portion 230 is shown in FIG. 7. The timing adjustment portion 230 adjusts the timing for outputting the data received from the input node 260 to the output node 262. The input node 260 is commonly connected to the gate of a PMOS transistor P1, the gates of a plurality of NMOS transistors 270 (M1~M8) connected in parallel and the gate of a NMOS transistor N1. Resistors R1, R2, . . . , R8 are connected in serial between the node RC and the plurality of transistors 270, wherein the node RC connects the transistors P1 and N1. The resistors R1~R8 are connected between the transistor M1 and the node RC. The resistors R2~R8 are connected between the transistor M2 and the node RC. For the node RC and the other transistors M3~M7, the resistor R3~R8 are connect in the same way as described above. The resistor R8 is connected between the transistor M8 and the node RC.

Also, NMOS transistor 280 comprising a plurality of transistors Q1~Q8 is connected between the transistor 270 and the ground GND. The gates of the transistors Q1~Q8 are applied by the 8-bit delay code generated as described in FIG. 6B. When all bits of the 8-bit delay code are "0", the transistors Q1~Q8 turn off and the current paths to the resistors R1~R8 are cut off That is, the input data applied to the input node 260 are output from the output node 262 and are not delayed by the time constant of the resistors R1~R8 and the capacitor C.

On the other hand, when all bits of the 8-bit delay code are "1", the transistors Q1~Q8 turn on and the node RC can be electrically connected to the ground GND through the resistors R1~R8. That is, the input data applied to the input node 260 are output from the output node 262 and are delayed by the time constant of the resistors R1~R8 and the capacitor C. In this way, the delay dependent on the RC time constant is adjusted with 8 phases in response to the 8-bit delay code.

Figure 8:
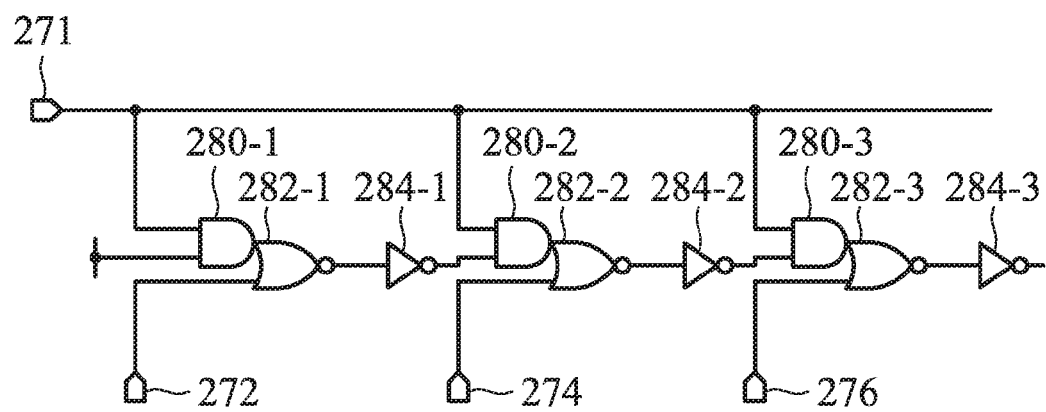
FIG. 8 shows a second example of a timing-adjustment portion according to some exemplary embodiments of the present disclosure.

The timing adjustment portion 230 of the structure in FIG. 7 adjusts the timing based on the RC delay. The timing adjustment portion 230 of the structure in FIG. 8 adjusts timing based on gate delay. In FIG. 8, the timing adjustment portion 230, at the node 271, comprises nodes 272, 274 and 276 receiving the delay code; AND gates 280; NOR gates 282; and inverters 284. Also in FIG. 8, the gate delay is described by an example using 3-bit delay code.

The data supplied from the input node 271 and the H level form the supply voltage are input to the NAND gate 280-1; the output of the AND gate 280-1 and the delay code applied to the node 272 are input to the NOR gate 282-1; and the output of the NOR gate 282-1 is input to the inverter 284-1. The data supplied from the input node 271 and the output of the inverter 284-1 are input to the NAND gate 280-2; the output of the AND gate 280-2 and the delay code applied to the node 274 are input to the NOR gate 282-2; and the output of the NOR gate 282-2 is input to the inverter 284-2. The data supplied from the input node 271 and the output of the inverter 284-2 are input to the NAND gate 280-3; the output of the AND gate 280-3 and the delay code applied to the node 276 are input to the NOR gate 282-3; and the output of the NOR gate 282-3 is input to the inverter 284-3.

The NOR gates is disabled when the delay code is of H level and is enabled when the delay code is of L level. That is, when the delay code is of H level, the output of the NOR gate is fixed at the L level and the output of the inverter is fixed at the H level. On the other hand, when the delay code is of L level, the output logic level of the NOR gate responds the logic level of the data input to the node 271. For example, when all bits of the 3-bit delay code are of L level, the data applied to the input node 271 can delayed by the 3-stage gates; and when 2 bits (nodes 274, 276) of the 3-bit delay code are of L level, the gate delay of the first stage gate is skipped thereby achieving delay of 2-stage gate.

An n-bit delay code is generated by the internal circuit delay estimation portion 210 during the time interval for inputting commands and addresses. The generated delay code is stored in the delay information storage portion 220. The timing adjustment portion 230 adjusts the timing of the data output portion 140 based on the delay code stored by the delay information storage portion 220. Therefore, the output data can be appropriately compensated for from the beginning in response to the falling edge of the external control signal without influence of the operation environment, as shown in FIG. 5B.

In the above embodiment, an example of estimating the delay of the internal circuit when commands and addresses are input has been described. However, the delay of the internal circuit can also be estimated when one of the commands or addresses is input. In addition, in cases where a command has been input, the delay of the internal circuit can be estimated when a specific command is input, wherein the specific command for example may be a read command which is accompanied by data that is output after a command.

Next, a second embodiment of the present disclosure is described as follows. The delay of the internal circuit is estimated while commands and addresses are being input, the based on the first embodiment. However, the delay of the internal circuit is re-estimated (re-evaluated) when the data are output based on the delay code and the delay code is updated based on the estimation result.

Figure 9:
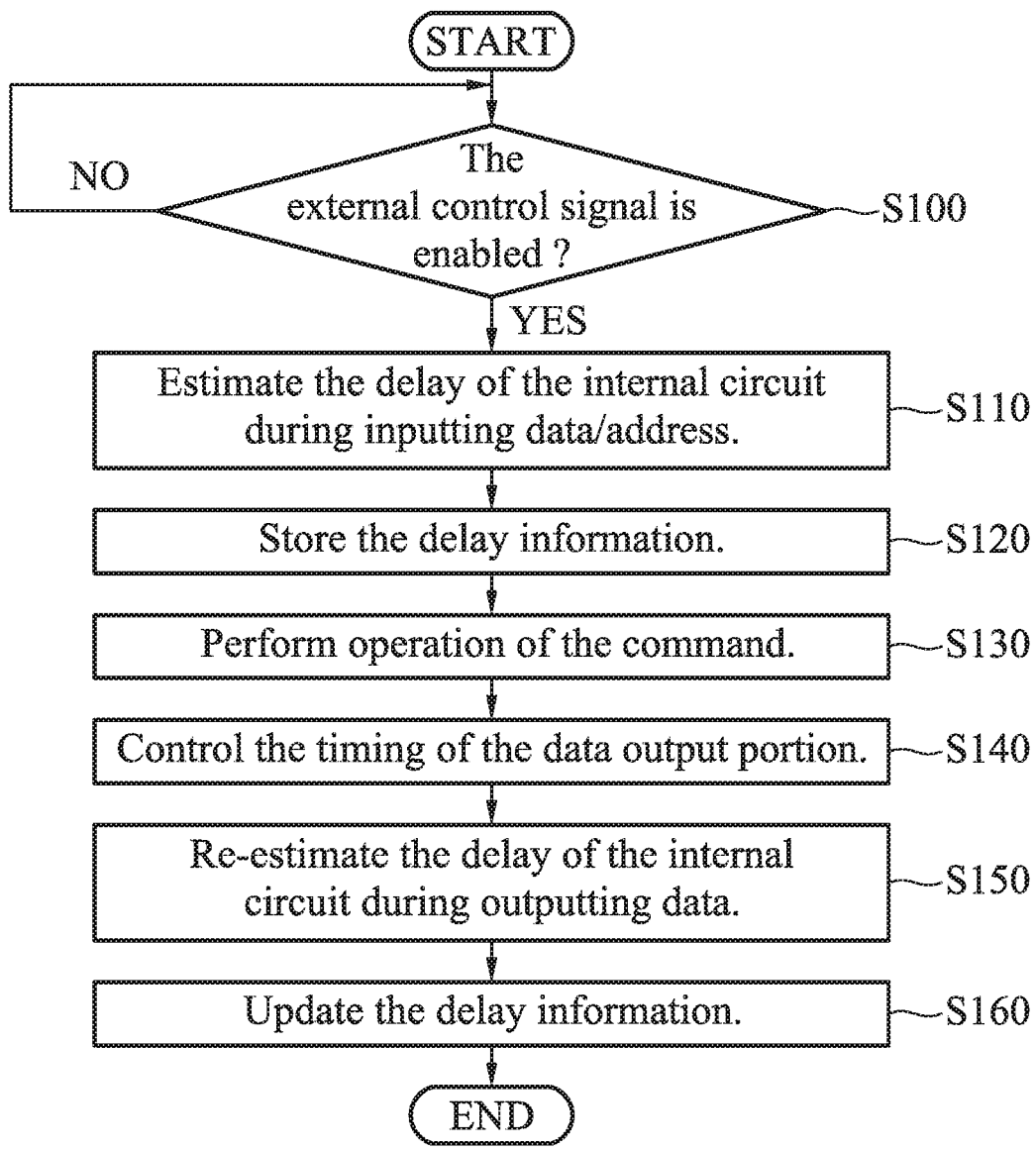
FIG. 9 is a flow chart for describing the operation of the delay-compensation portion according to a second exemplary embodiment of the present disclosure.

FIG. 9 is a flow chart showing the operation of a delay compensation portion according to the second embodiment of the disclosure. From start to the step S140 are the same as the steps described in FIG. 4. In step S150, the internal circuit estimation portion 210 estimates the delay of the internal circuit when the data output portion 140 outputs data in response to the read enable signal RE#. Furthermore, the internal-circuit delay estimation portion 210 updates the delay code stored in the delay information portion 220 as an up-to-date delay code (step S160).

Figure 10:
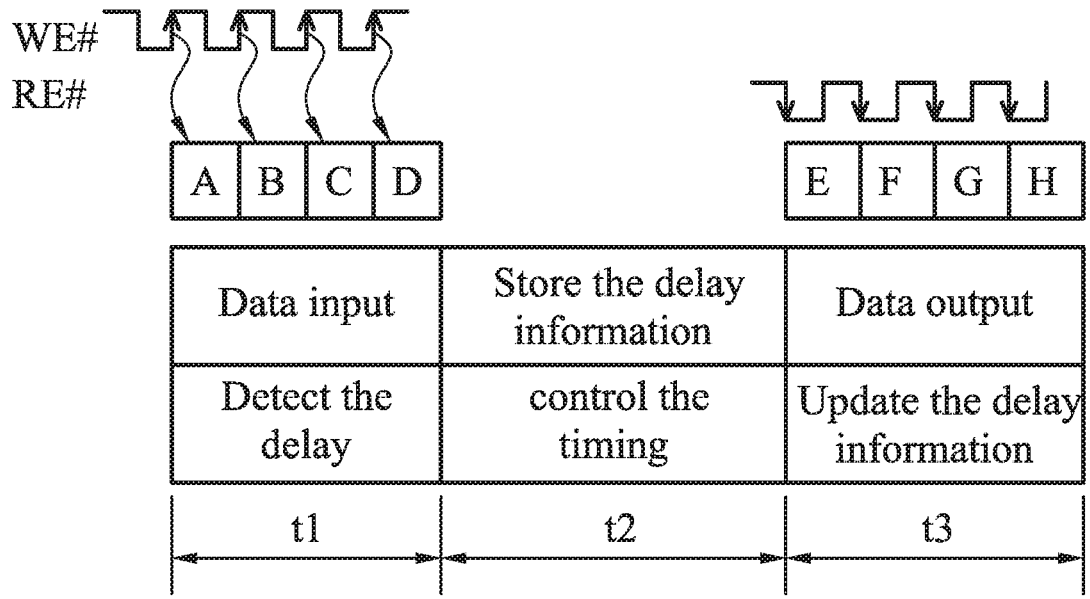
FIG. 10 is an example for updating delay information according to the second exemplary embodiment of the present disclosure.

FIG. 10 shows an example of the delay compensation portion according to the second embodiment. As shown in this figure, the semiconductor memory device 100 instructs the data output portion 140 to output read data. During the time interval of data outputting, the internal circuit delay estimation portion 210 re-estimates the delay of the internal circuit in response to the read enable signal RE# and updates contents of the delay information storage portion 220 based on the delay information obtained from the re-estimation. For example, the internal circuit 212, as shown in FIG. 6A, outputs the re-estimation signal TP from the output node 258 and the re-estimation signal TP is input to the delay code generation portion 214 when the read enable signal RE# is input. The delay code generation portion 214 generates the delay code based on the re-estimation signal TP, whereby the contents of the delay information storage portion are updated by the delay code.

According to the second embodiment, performing an update using the delay information obtained from the up-to-date delay estimation can guarantee an appropriate delay compensation, in changeable operation environments.

Next, a third embodiment of the present disclosure is described as follows. In the third embodiment, the semiconductor memory device 100 calibrates delay information based on the detected temperature information when the semiconductor memory device 100 has the function of detecting the temperature information related to operation temperature. In a preferred embodiment, a delay information calibration portion maintains a table or relationship which correlates regulated operation temperature and delay time, and calibrates the delay information obtained by the internal circuit delay estimation portion 210.

Figure 11:
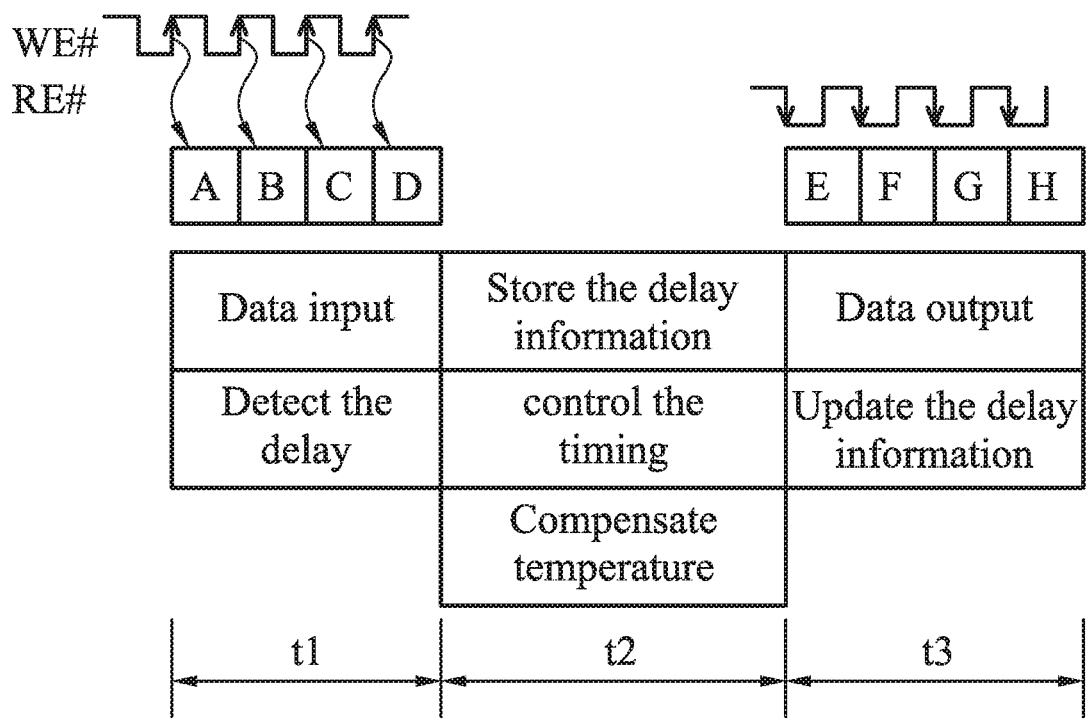
FIG. 11 is an example for updating delay information according to a third exemplary embodiment of the present disclosure.

FIG. 11 is a preferred example of the delay compensation operation. The delay information calibration portion, during the time interval t2 after the delay estimation of the internal circuit has been performed, utilizes the operation time interval when command-based operation is performed, and detects the temperature information and carries out temperature compensation of the delay information based on the detected temperature in the operation time interval. Preferably, the timing adjustment portion 230 adjusts the timing of the data output portion 140 based on the delay information to which temperature compensation has been performed. In this way according to the third embodiment, calibrating the delay information based on the temperature information before outputting data can perform temperature compensation to the timing of the data output portion 140.

Figure 12:
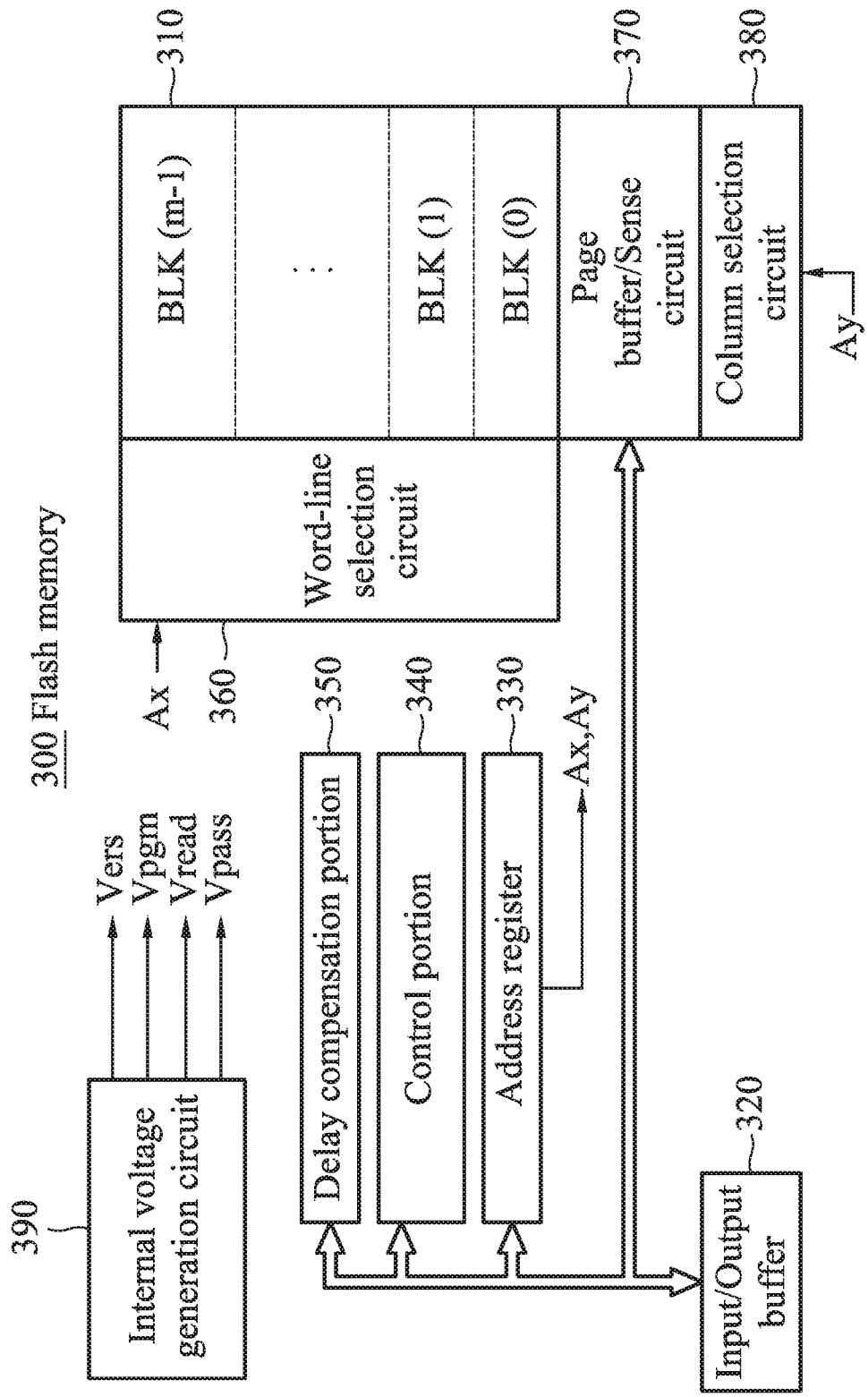
FIG. 12 shows block diagrams of a NAND-type flash memory of some exemplary embodiments of the present disclosure.

Use NAND-type flash memory as a preferred example of the semiconductor memory device 100. FIG. 12 shows a flash memory structure of this embodiment. The flash memory 300 comprises a memory array 310, an input/output buffer 320, an address register 330, a control portion 340, a delay compensation portion 350, a word line selection circuit 360, a page buffer/sense circuit 370, a column selection circuit 380 and an internal voltage generation circuit 390. The memory array 310 has a plurality of memory cells arranged in a matrix. The input/output buffer 320 connects external I/O terminals and keeps input/output data. The address register 330 receives address data from the input/output buffer 320. The control portion 340 controls each portion and receives the command from the input/output buffer 320 and the control signal from the outside. The word line selection circuit 360 receives row address information Ax from the address register 330 and performs selection of block and word line based on the result of decoding the row address information Ax. The page buffer/sense circuit 370 keeps the data read from the page selected by the word line selection circuit 360 and keeps the write data written to the selected page. The column selection circuit 380 receives column address information Ay and performs selection of data in the page buffer/sense circuit 370. The internal voltage generation circuit 390 generates various voltages required for reading, programming and erasing data such as write voltage Vpgm, pass voltage Vpass, read voltage Vread, erase voltage Vers, etc.

The memory array 310 has m memory blocks BLK(0), BLK(1), . . . , BLK(m-1). Each of the memory blocks has a plurality of NAND strings, each of which comprises a plurality of memory cells connected in serial. Each NAND string comprises a plurality of memory cells connected in serial, a bit-line-side selection transistor connected in one terminal of the memory cell, and a source-line side selection transistor connected in the other terminal of the memory cell; wherein the source of the bit-line side selection transistor connects a corresponding bit line and the source of the source-line side selection transistor connects a common source line.

In read operation of the flash memory 300, a certain positive voltage is applied to the bit line, a certain voltage for example 0V is applied to the selected word line, a pass voltage Vpass for example 4.5V is applied to the non-selected word line, and a positive voltage for example 4.5V is applied to the selected gate line, thereby turning on the bit-line side selection transistor, the source-line side selection transistor, and a voltage of 0V is applied to the common source line. In the program (write) operation of the flash memory 300, a high program voltage (15~25V) is applied to the selected word line and an intermediate voltage such as 10V is applied to the non-selected word line so as to turn on the bit-line side selection transistor, turn off the source-line side selection transistor and provide voltage level corresponding to the information of "1" or "0" to the bit line. In the erase operation of the flash memory 300, 0V is applied to the selected word line in the blocks and a high voltage for example 20V is applied to the P well, thereby pulling the electrons of the floating gate to the substrate and erasing the data block by block.

The delay compensation portion 350 estimates the delay of the internal circuit in the time interval during which the commands and addresses are being input, stores the delay information of the estimation result in the memory portion.

Figure 13:
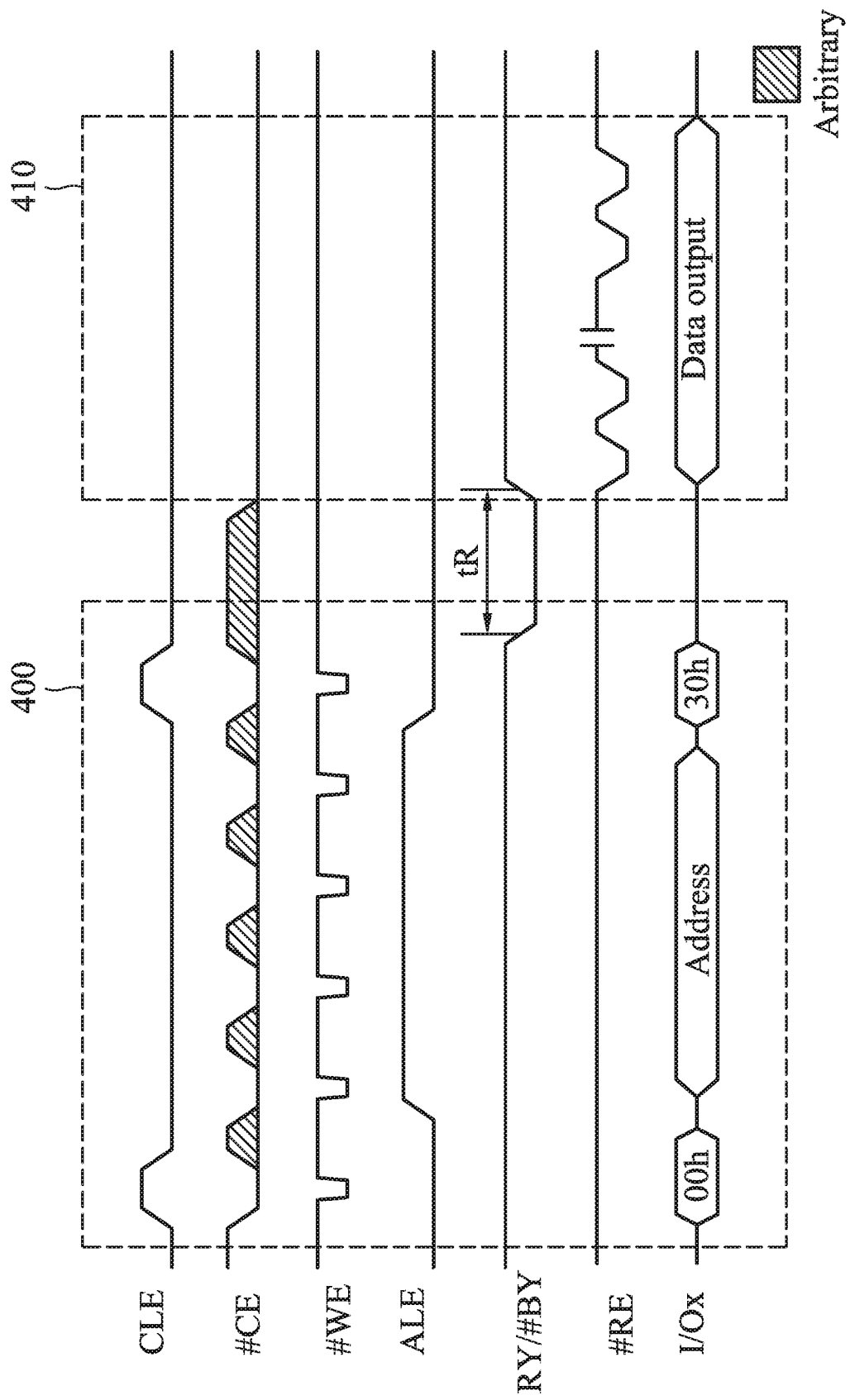
FIG. 13 is a flow chart for describing the timing of the delay-compensation of a NAND-type flash memory according to some exemplary embodiments of the present disclosure.

After performing the data read operation from the selected memory cell of the memory array, the delay compensation portion 350 adjusts the output timing based on the delay information when the read data are output from the input/output buffer 320. FIG. 13 shows operation waveforms of the flash memory 300. Numeral 400 indicates the time interval during which the commands and addresses are being input. The chip enable signal CE# becomes L level, and when the command latch enable signal CLE is of H level, the command is taken into the input/output buffer 320 in response to the rising edge of the write enable signal WE#. After that, when the address latch enable signal ALE is of H level, the address is taken into the input/output buffer 320 in response to the rising edge of the write enable signal WE#. After that, the command for reading is taken into again.

During the time interval of carrying out the information reading, the delay of the internal circuit in the flash memory 300 is estimated and the delay based on the estimated result is stored in the storage portion. In response to clock operations of the write enable signal WE# which is the external control signal, when a plurality of estimated results are obtained, the up-to-date estimated result is stored in the storage portion.

In the time interval of reading data from the memory array, the busy signal is output, after that, data output is performed in the time interval indicated by the numeral 410 in FIG. 13. In response to the falling edge of the read enable signal RE#, the read data which are kept in the input/output buffer 320 are output through the I/O terminal. The delay compensation portion 350 can adjust the output timing of the input/output buffer 320 based on the estimated delay information, perform delay compensation to the read data without depending on the chip environment and outputs data in response to the falling edge of the read enable signal RE#. In this way, even though the frequency of the read enable signal RE# is not high, the reading corresponding to it is enabled.

Here, the read operation serves as an example. However, estimating the delay of the internal circuit can be carried out in the program operation when the command, address and program data are input, or in the erase operation when the command, address and program data are input, and the delay information of the estimated result is stored. In this case, when the delay information has been stored, the delay information is updated to the up-to-date delay information.

Figure 14:
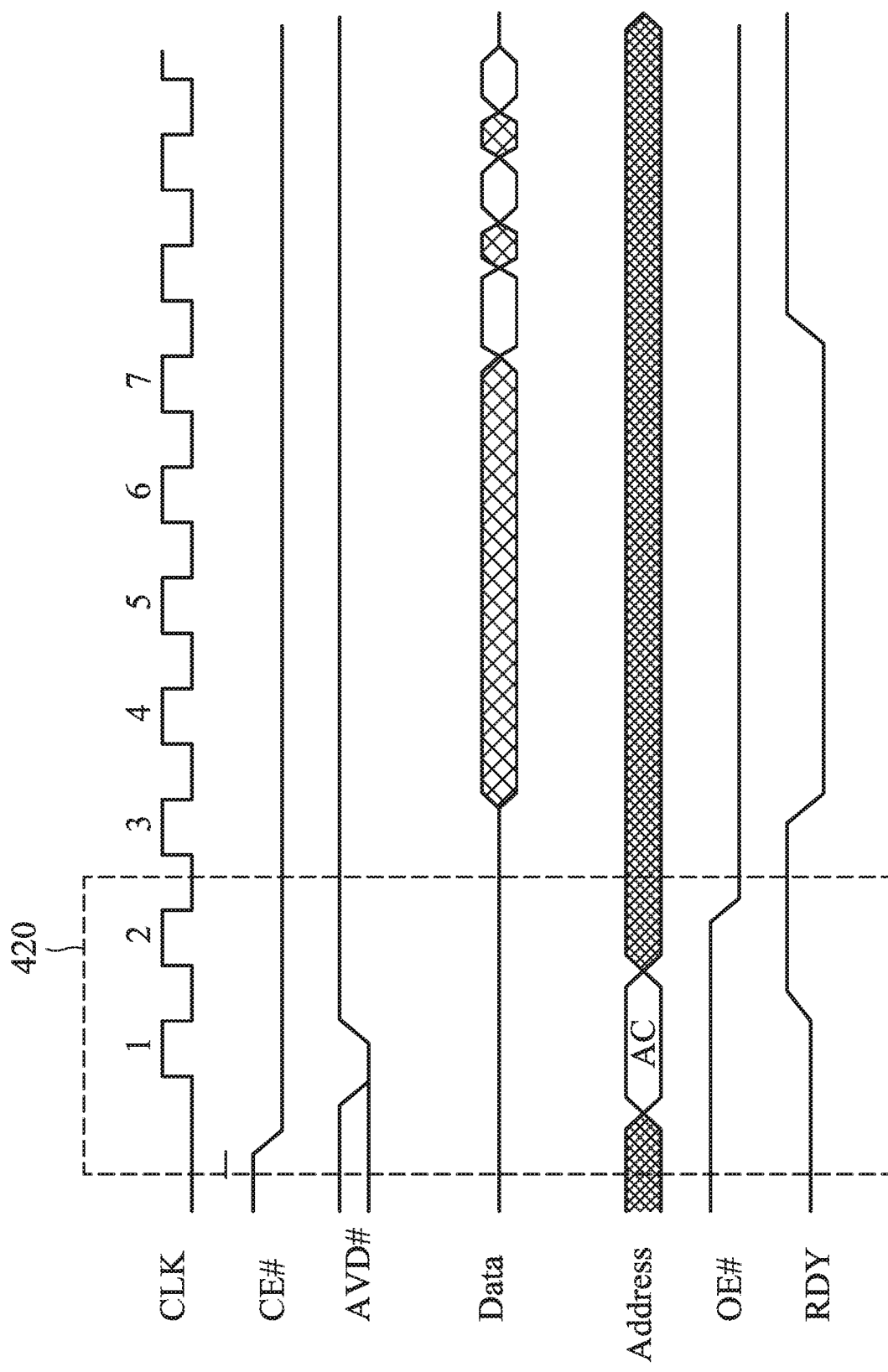
FIG. 14 is a flow chart for describing the timing of the delay-compensation of a NOR-type flash memory according to some exemplary embodiments of the present disclosure.

In addition, NOR-type flash memory, like the NAND-type flash memory, utilizes the external control signal to input commands and addresses, and so the present disclosure is applicable in a NOR-type flash memory. FIG. 14 shows waveforms in the read operation of the NOR-type flash memory. Numeral 420 indicates the time interval during which the commands and addresses are being input. When the chip enable signal CE# has changed to the L level, the address is input in response to the rising edge of the clock signal CLK. The delay compensation portion 350 estimates the delay of the internal circuit in the time interval that the address is input. Next, the data of the selected memory are read from the memory array and the ready signal RDY becomes H level in this time interval. When the ready signal RDY has changed L level and the output enable signal OE# becomes L level, the read data is output in response to the rising edge of the clock signal CLK. At this time, the timing of the initial output data is adjusted based on the delay information.

The preferred embodiments have been disclosed in detail as described above. It is to be understood that the disclosure is not limited to the disclosed embodiments. The scope of the appended claims should be accorded the broadest interpretation so as to encompass all such modifications and similar arrangements.

What is claimed is:

1. A semiconductor memory device, comprising:
    a data input device, configured to receive input data in response to an external control signal;
    a delay estimation device, comprising an internal circuit configured to be operable in response to the external control signal and generate an estimation signal for indicating delay time of the internal circuit, wherein the delay estimation device is configured to estimate the delay time of the internal circuit during a time interval for receiving the input data, and configured to store a delay information obtained from the estimate to a memory unit;
    a memory array, having a plurality of memory elements;
    a data output device, configured to output data read from the memory array in response to the external control signal; and
    a timing adjustment device, configured to adjust output timing of the data output device based on the delay information stored in the memory unit.

2. The semiconductor memory device as claimed in claim 1, wherein the delay estimation device further is further configured to estimate the delay time of the internal circuit during the time period when the data output device outputs data, and further configured to update the delay information stored in the memory unit according to the delay information obtained from the estimate.

3. The semiconductor memory device as claimed in claim 1, further comprising a detection device configured to detect temperature information related to operation temperature; wherein the delay estimation device comprises a calibration device configured to calibrate the delay information based on the temperature information.

4. The semiconductor memory device as claimed in claim 1, wherein the internal circuit comprises an RC delay device configured to generate the estimation signal indicating delay time.

5. The semiconductor memory device as claimed in claim 4, wherein the delay estimation device comprises a delay code generation device configured to generate a delay code based on the estimation signal output from the internal circuit and the generated delay code serves as the delay information and is stored in the memory unit.

6. The semiconductor memory device as claimed in claim 1, wherein the timing adjustment device is configured to adjust RC delay of the data output device based on the delay information.

7. The semiconductor memory device as claimed in claim 1, wherein the timing adjustment device is configured to adjust gate delay of the data output device based on the delay information.

8. The semiconductor memory device as claimed in claim 1, wherein the external control signal is a write enable signal for reading the data into the data input device.

9. The semiconductor memory device as claimed in claim 1, wherein the external control signal is a read enable signal for outputting the data from the data output device.

10. The semiconductor memory device as claimed in claim 1, wherein the input data is a command.

11. The semiconductor memory device as claimed in claim 1, wherein the input data is a command related to a read operation and the timing adjustment device is configured to adjust the timing of the data output device when outputting read data.

12. The semiconductor memory device as claimed in claim 1, wherein the semiconductor memory device is a NAND-type flash memory.

\* \* \* \* \*